United States Patent [19]

Fayolle et al.

[11] 4,151,459
[45] Apr. 24, 1979

[54] METHOD OF AND APPARATUS FOR THE LOCALIZING OF SECURITY LINE FAULTS FOR SKI LIFTS AND THE LIKE

[75] Inventors: Aimé Fayolle, Grenoble; Michel Rignon, Le-Pont-de-Claix, both of France

[73] Assignee: Metraplan Spaa - Societe Anonyme, Isere, France

[21] Appl. No.: 746,881

[22] Filed: Dec. 2, 1976

[30] Foreign Application Priority Data

Dec. 3, 1975 [FR] France .................... 75 37694

[51] Int. Cl.² ............................ G01R 31/11
[52] U.S. Cl. ................................ 324/52
[58] Field of Search ............. 324/52, 51, 73 R, 58 B, 324/58.5 B; 179/175.3 F

[56] References Cited
U.S. PATENT DOCUMENTS

| | | | |
|---|---|---|---|
| 3,031,643 | 4/1962 | Sheftelman | 324/52 X |
| 3,517,306 | 6/1970 | Anderson et al. | 324/52 |
| 3,614,608 | 10/1971 | Giedd et al. | 324/73 R |
| 3,636,443 | 1/1972 | Singh et al. | 324/73 R |
| 3,710,240 | 1/1973 | Kuehnemann et al. | 324/52 |
| 3,716,783 | 2/1973 | Deering | 324/51 X |
| 3,727,128 | 4/1973 | McFerrin | 324/52 |
| 3,753,086 | 8/1973 | Shoemaker | 324/52 |
| 3,991,362 | 11/1976 | Blair et al. | 324/51 |

OTHER PUBLICATIONS

Gale, P. F., *Cable-fault location by impulse-current method* Proc. IEE, vol. 122, No. 4, Apr. 1975 pp. 403–408.

*Primary Examiner*—Gerard R. Strecker
*Attorney, Agent, or Firm*—Karl F. Ross

[57] ABSTRACT

A method of and an apparatus for localizing line faults in security lines for ski lifts and the like in which a voltage step is applied to the security line, the response to this voltage step is determined and this response is compared to the response obtained in the absence of a fault, the difference resulting from the comparison indicating the place of the fault and the type of fault.

12 Claims, 5 Drawing Figures

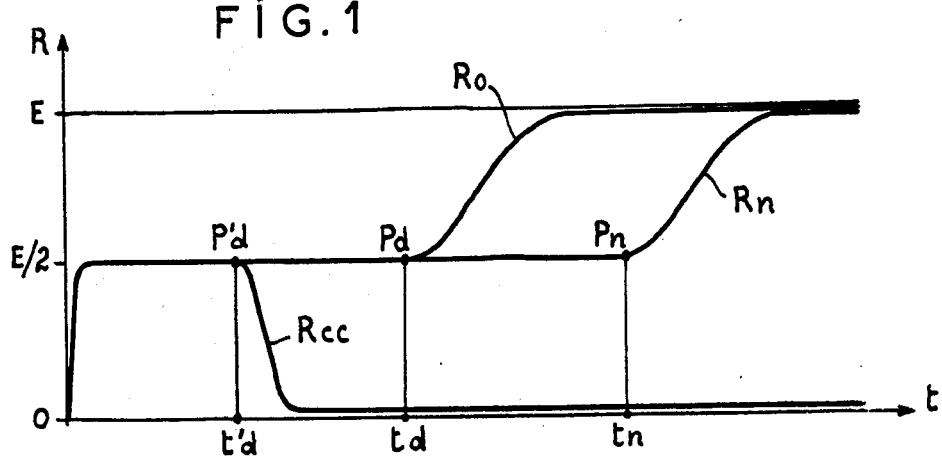
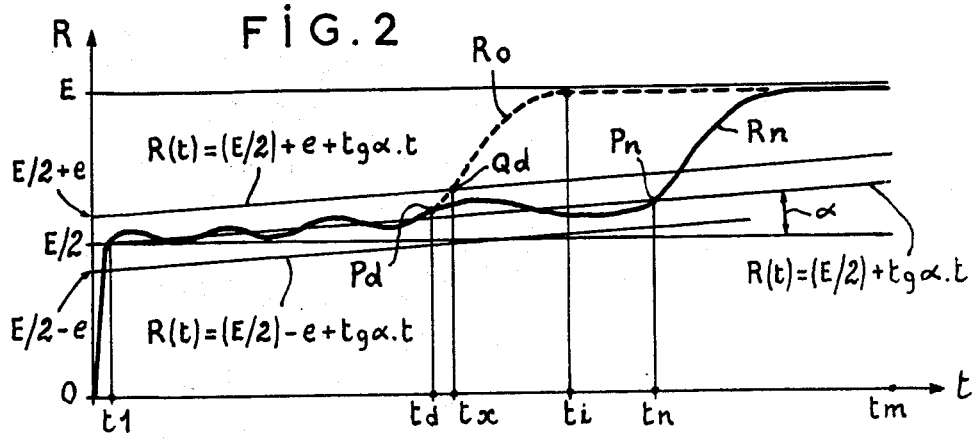

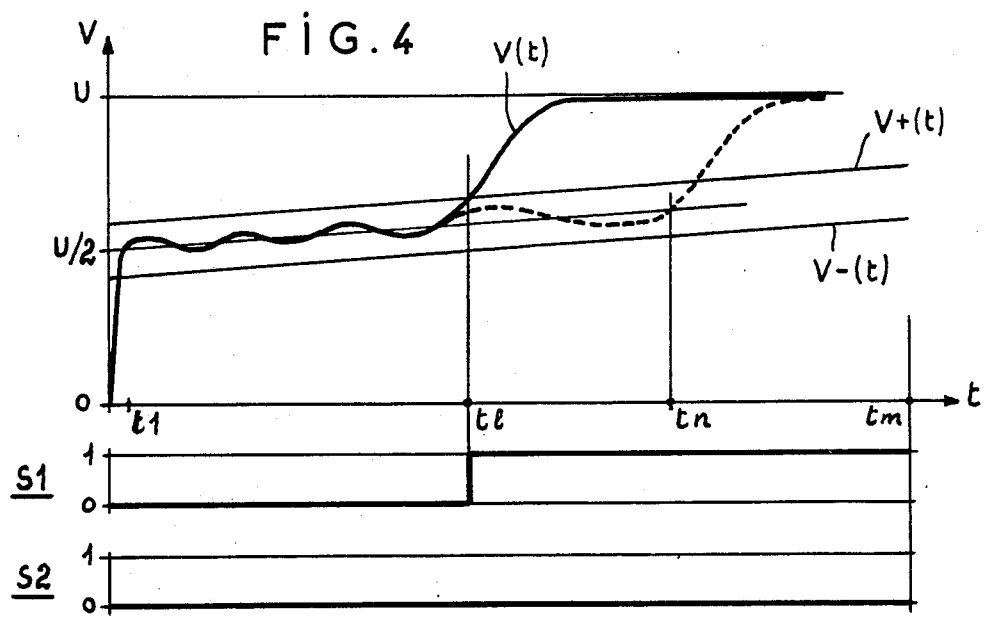
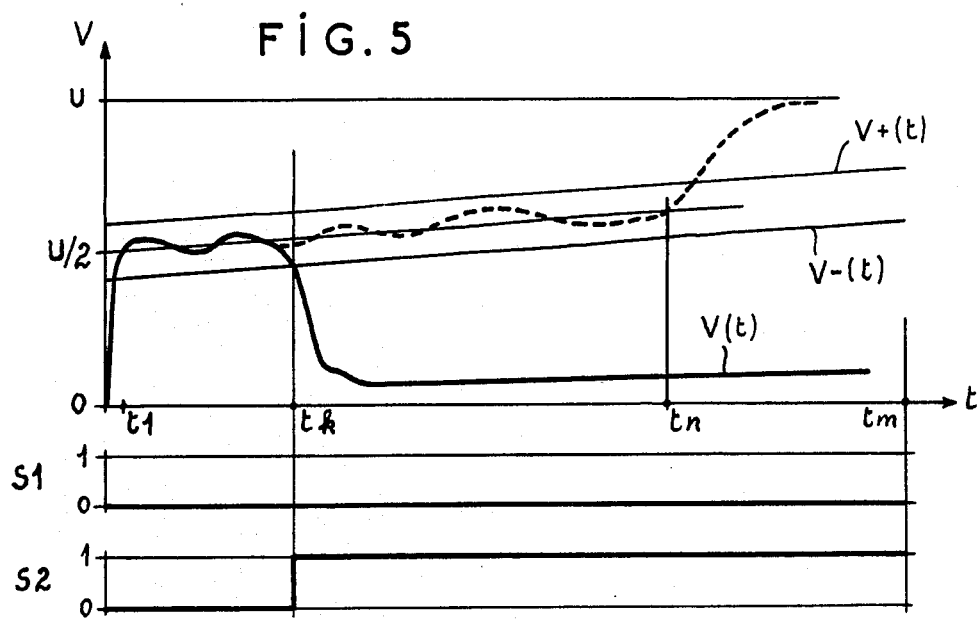

METHOD OF AND APPARATUS FOR THE LOCALIZING OF SECURITY LINE FAULTS FOR SKI LIFTS AND THE LIKE

FIELD OF THE INVENTION

The present invention relates to a method of and an apparatus for localizing the faults of security lines for ski lifts and, more particularly, to a system for locating a fault and discerning the type of fault in security lines for ski lifts and like cable railways.

BACKGROUND OF THE INVENTION

Cable railways and like systems, especially ski lifts, in which a vehicle or personnel carrier is displaced by a carrying cable strung over a number of pylons from one terminal station to another terminal station are of widespread use at winter sports facilities and the like and are generally equipped with means for halting the operation of the ski lift in the event of a derailment of the carrying cable.

This device comprises, in general, a security unit located at one of the stations of the ski lift, usually the lower station, and provided with a continuous voltage generator and a galvanometer, an aerial safety line (security line) connecting the circuit breakers which respond to derailment of the carrying cable at each of the pylons and which interrupt the circuit, the line running the full length of the ski lift, and an equilibration resistance located usually at the other terminus of the line, generally the upper station, which is usually returned to ground.

By measuring the current flow, the detector unit at the lower station is able to interrupt the operation of the ski lift when one of the circuit breakers, responding to derailment of the carrying cable and serving as a detector thereof, open-circuits and indicates via the aerial line a defect represented by an open-circuit condition or a grounding condition.

Because of the problems prevailing in mountainous regions, for effective use of the system it is necessary to rapidly localize, i.e. locate, the particular defect so that the derailment at the detected location can be remedied and the ski lift placed again in service.

In practice it has been found that the localization of the fault is less precise than is desired with existing apparatus and requires some time to investigate the particular site of the derailment along the line. One localization device currently in use provides resistances of fixed value in parallel with the respective interruptors or circuit breakers so that the needle of the galvanometer has a specific position for the opening of the interrupters. This system has been found to be effective for the detection of cable derailments but is ineffective for the localization of a transient fault, i.e. does not respond in the case of such transient faults.

OBJECT OF THE INVENTION

It is the principal object of the present invention to provide a method of and an apparatus for localizing the various faults which arise in security lines of the character described in such manner as to permit the locating of the fault to be effected in a rapid and precise manner and which also enables the identification of the type of fault even in the case in which it is transient.

SUMMARY OF THE INVENTION

This object and others which will become apparent hereinafter are attained, in accordance with the present invention, in a process in which a voltage step is applied to the security line and the response of this line to the voltage step is recorded and compared to the response of the same line registered in the absence of the fault. The difference between the two responses and the sense of the deviation with respect to the normal response indicates the place of the fault and the type of the fault.

BRIEF DESCRIPTION OF THE DRAWING

The above and other objects, features and advantages of the present invention will become more readily apparent from the following description, reference being made to the accompanying drawing in which:

FIG. 1 is a graph or a so-called "echogram" illustrating the process of the present invention;

FIG. 2 is a graph illustrating a more accurate or more precise process, within the scope of the invention, for detecting the location and nature of faults along a cable line;

FIG. 4 is a graph illustrating the response curve of a first type of fault and illustrating its localization and identification, using the apparatus of FIG. 3; and FIG. 5 is a graph similar to that of FIG. 4 but corresponding to a second type of fault.

SPECIFIC DESCRIPTION

Figure 3:
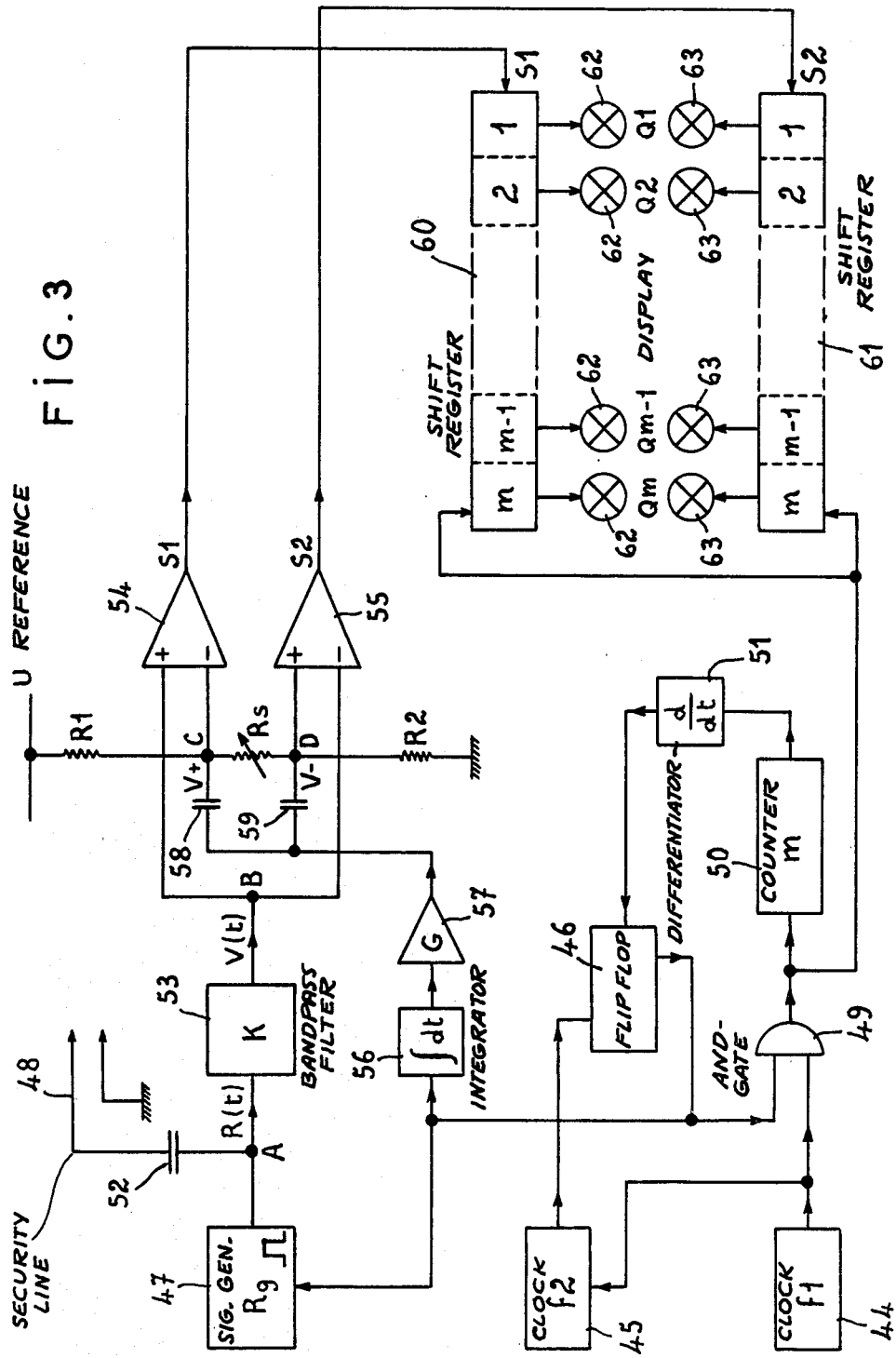
FIG. 3 is a block diagram of an apparatus for practicing the process of the present invention.

FIG. 1 schematically illustrates a process for carrying out the present invention and is a so-called "echogram" showing the graphed response of the security line in the absence of a defect and the responses for two faults of the type which usually occur, as if these would have been plotted on an oscilloscope or by a graphic recorder. The graph shows the voltage amplitude, plotted along the ordinate, vs. time, plotted along the abscissa, the origin o representing the initiation of the applied pulse and hence the initiation of the measured responses, and the time t representing the time from the application of the pulse at to. The amplitude is given in voltage.

The voltage-step signal of level E is applied to the security line of the ski lift by a generator whose internal resistance is equal to the characteristic resistance of the security line.

In the absence of a fault, the normal response represented by the curve Rn has a rapid rise to the level E/2 and then plateaus at this level E/2. At tn, corresponding to the point Pn of the curve, the response shows a "jump" to a value of approximately E. This point Pn corresponds to the echo from the end of the line at a distance $X_L$ from the point of application of the signal according to the relation $tn = 2X_L/v$, where v represents the propagation velocity of the signal.

If the fault is a break or open circuiting of the line, the response Ro is obtained. This response has at a point Pd, ahead of the point Pn, a positive "jump" to a level close to E. If the fault is constituted by a grounding or a short circuit, the response Rcc is obtained. This response shows, beginning at P'd ahead of point Pn, a negative "jump" which reduces the level to approximately nul (close to the abscissa Ot).

In either case, the fault results from a change in the resistance characteristic of the line which modifies the response at a time td or t'd which reflects the location, i.e. the distance Xd of the fault from the point of application of the signal so that the time td of the fault is $td = 2Xd/v$.

Thus, by comparison of the response registered with a normal response, it is possible to determine the place of the defect and its nature.

In the process according to the present invention, the recorded response of the security line is advantageously compared with two predetermined values which bracket the response obtained in the absence of a defect and the results of these two comparisons expressed by the logic levels "0" and "1" are recorded at successive instants whose interval corresponds to a predetermined frequency and the aggregate of these recorded results is displayed at the ends of a period of time permitting analysis of the line over its entire length.

This double comparison process, carried out with a selected convenient periodicity, permits the detection of the instant td or t'd at which the response Ro or Rcc deviates from the normal and the direct reading of the instant and hence place of the fault. The normal response curve Rn can thus be "memorized" in the form of the two limits which bracket it. The results are displayed in quantified form by registering the two logic levels "0" or "1" to permit noncontinuous but successive comparisons of the instants $t_1, t_2, \ldots, t_m$ which affords visual display of the state of the line and an immediate interpretation.

In order to permit monitoring of the actual tendencies of the curves representing the responses of a security line with precision, reference may be had to FIG. 2 in which it is shown that the response of the line is advantageously compared to two values bracketing the response obtained in the absence of a fault and which are linear functions of time.

The period over which the line is analyzed along its length with the aid of the present process can be substantially smaller than those over which the results are displayed to permit a visual display of the defect. To this end, according to the invention, the application of the voltage step and the analysis of the response of the security line are carried out periodically with a frequency such that the time over which the line is analyzed over its length is smaller than the dead time permitting the reading of the displayed results.

Each analysis period is thus subdivided into an active cycle in the course of which the voltage step is applied and the comparisons described above are made, and a dead time during which the results are stabilized and displayed, the eye of the observer seeing only the displayed results during the dead times.

The present invention also provides a circuit, system or apparatus designed to carry out the localization process described above with periodic analysis. This device comprises, in combination, a first clock defining the frequency corresponding the interval separating the successive instants over which the results of the comparisons are recorded, a second clock controlled by the first and defining the analysis frequency of the security line, a signal generator controlled by the second clock for applying the voltage step to the security line, means for delivering two electrical reference levels representing the values bracketing the response obtained in the absence of a fault, two comparators adapted to compare the response of the line to one and the other of these two values, and means for registering and displaying the results obtained from these comparators, the latter means being controlled by the first clock.

In order to synchronize the signal generator applying the voltage step with the active cycle of each analysis period, the generator is connected, according to one embodiment of the invention, to the output of a bistable multivibrator or flip-flop whose one input receives the pulses from the second clock while its other input is connected to a calculator adapted to count the pulses of the first clock until the counted pulse number is equal to the number of successive instants over which the results of the comparison are registered. When the maximum count is obtained, the counter triggers the flip-flop to "0" and, as result, stops the signal generator.

According to another feature of the invention, the means delivering the two electrical signal levels or values representing the values bracketing the response obtained in the absence of a fault, comprises three electrical resistances connected in series between two points of predetermined potential, the two extreme or outer resistances being fixed while the central or intermediate resistance is variable (e.g. a potentiometer), the points between the variable central resistance and the two extreme fixed resistances being connected to the inputs of the two comparators which do not receive the response of the line. This variable resistance permits adjustment of the spread separating the two values bracketing the normal response of the line.

Advantageously, the two points located between the central variable resistance and the two extreme fixed resistances are also connected, via condensers, to the means delivering a corrective signal which is a linear function of time and of a null value at the begining of each analysis period defined by the second clock. This means, which can comprise an integrator, permits representing the limiting values bracketing the normal response as linear functions of time in the form of electrical voltages.

According to still another feature of the invention, the means for registering and displaying the results comprises two shift registers having a number of stages corresponding to the number of successive instants over which the results of the comparisons are to be registered, the signal input of each register being connected to the output of one of the comparators. The shift of each register is effected in synchronism with the pulses of the first clock.

The functioning of these registers is such that, at the end of each active cycle, the contents of their successive stages correspond to the results of the comparisons effected at the instants $t_1, t_2, \ldots, t_m$.

The display means are advantageously constituted by two series of illuminated lamps (light bars) with each lamp being connected to one stage of one of the aforementioned shift registers and indicating by its extinguishment or its illumination if the logic level registered in the corresponding stage is "zero" or "one".

In the case of a fault, the number of the first lamp lit or extinguished and its position in one or the other of the light bars indicates respectively the place and the nature of the fault. In effect, the position of the latter light is read at the instant tx at which the respective comparator detects the development of a deviation from the normal response of the line, this instant also representing the place of the fault while the light bar on which the lamp lies, corresponding to the shift register and comparator associated with the respective defect, shows immediately whether the fault is of the open-circuit or short-circuit type. The ratio of the dead time, during which the registers are fixed, to the duration of the active cycle can be chosen so that the observer sees only the state of the lamps during the rest time.

Referring again to FIG. 2, in which the normal response Rn of the security line is represented graphically in a manner which is more precise than that of FIG. 1, it can be seen that the curve of the response is not perfectly smooth as has been described with respect to FIG. 1 in which the theoretical curve was traced assuming the line is uniform throughout its length and without losses. In reality the security line is not homogeneous over its entire length and possesses losses which are not negligible. The form of the curve obtained, therefore, while showing sharp jumps as previously described, does not have a perfectly flat plateau.

To a first approximation, the equation of the curve Rn can be, between t=0 and t=tn, by an equation of the form $R(t) = (E/2) + tg\ \alpha.t$. The plateau region does have detectable oscillations. The curve Rn is flanked by two parallel lines disposed above and below the response curve and having respective equations as follows:

$$R(t) = (e/2) + e + tg\ \alpha.t$$

and $$R(t) = E/2 - e + tg\ \alpha.t.$$

The value of the spread e is selected in such manner thet the two lines flank equally over the entire length of the plateau, the response curve Rn, and are crossed in the event of a defect. Thus, in the case of the open-circuit response curve Ro, the line $E/2 + e$ is not crossed until a point Qd, shortly after the response curve Ro begins to deviate at point Pd and time td from the normal response curve Rn.

In the process of the present invention, at the successive points ti, the registered response R(ti) is compared with the limiting values: $(E/2) + e + tg\ \alpha.ti$, in such manner as to determine the value of ti at which the response curve departs from the zone of tolerance comprised between the lines $$R(t) = (E/2) = (E/2) + e + tg\ \alpha.t$$

and $$R(t) = (E/2)) - e + tg\ \alpha.t.$$

The circuit for carrying out the process of the present invention is illustrated in FIG. 3.

FIG. 3 shows, in block diagram form, a first clock 44 of frequency f1 which operates a second clock 45 of frequency f2, less than that of frequency f1. The output of clock 45 is connected to one input of a bistable multivibrator or flip-flop 46 of the type "flip-flop D", whose output is connected to the signal generator 47 which applies the voltage step to the security line. The signal generator 47 has an internal resistance Rg equal to the characteristic resistance Rc of the security line which is represented diagrammatically at 48.

The output of the bistable multivibrator 46 is also connected to one input of an AND gate 49 whose other input is fed from the output of clock 44 at the frequency f1. The output of the AND gate 49 is connected to a counter 50 adapted to count the pulses received to a maximum number designated at m.

The output of counter 50 is connected to a second input of the bistable multivibrator 46 by the intermediary of a differentiator 51.

This part of the circuit ensures the decay with time of the step signal which was emitted in the following manner:

The clock 45 of frequency f2, synchronized with the clock 44, defines the analysis frequency of the security line 48. At the end of each cycle, the bistable multivibrator 46 is at a logic level "1", so as to excite the signal generator 47 to apply the step signal and open the gate 49. The counter 50 counts at the frequency f1 of the clock 44 until it reaches its maximum count m, at the end of the time $T = m/f1$, the bistable multivibrator 46 is reversed, i.e. given a logic level "0" by the intermediary of the differentiator 51. The active cycle of the device is thus terminated and the dead time $T' = (1/f2) - (m/f1)$, so that this time is necessarily positive, the frequencies f1 and f2 must correspond to the inequality $f1 > m.f2$.

The output of the signal generator 47, represented at the point A, is connected to the security line 48 through a condenser 52 of a low reactance with respect to the resistance $Rg + Rc = 2Rc$, which permits connecting the circuit of the invention to a line under voltage.

The responses of the line are received at the same point A at which the device is connected to both the line and the signal generator. The device for detecting the response comprises a band pass filter 53 which reduces the noise at the band of the frequency utilized and delivers a nul potential at its output represented by the point B at the start of the measurement cycle, i.e. $t=0$. The transmittance K of the filter 53 in its pass band is equal to a certain ratio U/E such that an amplitude of the value E/2 of the response at point A corresponds to an amplitude of the value U/2 at the point B, the values of E and U being defined by the signal/noise ratio and the characteristics of the respective circuits.

The point B is connected to one input of a first comparator 54 and to one input of a second comparator 55 for comparison of the amplitutde at the output 53 with two electrical levels designated respectively V+ and V−. These two levels are fixed in a manner to correspond to the limiting values $(E/2 + e + tg\alpha.t$ and $(3/2) - e + tg\alpha.t$ which flank the normal response Rn of the security line (see FIG. 2) and, more precisely, so as to be equal to the product of these values and the transmittance K of the filter 53.

The second input C of comparator 54 is connected to a point at reference potential U through a resistor $R_1$. The second input D of comparator 55 is connected to point at nul potential by the resistor R2 and the points C and D are connected together by a thrid controllable resistor Rs. The resistors R1 and R2 are chosen to be equal to the same value RO which provides at C and D, two potential, V+ and V− which are symmetrical with respect to U/2 and are determined as functions of the controllable resistor Rs in accordance with the relationships $V+ = (U/2) + f(Rs)$ and $v- = (U/2) - f(Rs)$, with $$f(rs) = U/2 . (Rs/2\ RO + Rs).$$

In addition, means are provided to adjust the values V+ and V− by applying to them an oscillating term which is a function of time and proportional to pick up the relationship:

$$tg\alpha.t(\text{or } K.tg\alpha.t) = (U/E).tg\alpha.t, .t,$$

so that the values V+ and V− are faithful images of the lines $$R(t) = (E/2)+e+tg\alpha.t$$

and $$R(t) = (E/2)-e+tg\alpha.t$$

traced in FIG. 2.

The corrective term (U/E), $tg\alpha.t$ is introduced at the points C and D by a circuit which comprises an integrator 56, an amplifier 57 and two condensers 58 and 59. The integrator 56 is connected to the output of the bistable multivibrator 46 and thus ensures integration over the time T previously defined, of a signal of constant level. The output of the integrator 56 is connected to the input of the amplifier 57 which has a gain G adjustable to permit modification of the corrective term in proportion to the time constant of the integrator in order to establish the value $(U/E).tg\alpha.t$.

This value is supplied to the points C and D through the respective condensers 58 and 59.

Furthermore, the control resistor Rs is adjusted so that the function f(Rs) is the image of the spread e defining the flanks of the normal response of the security line. Thus the potentials V+ and V−, equal to:

$$V+(t) = (U/2)+f(Rs)+(U/E).tg\alpha.t$$

$$V-(t) = (U/2)-f(Rs)+(U/E).tg\alpha.t$$

flank the value V(t) delivered at B in the same manner as the two lines $R(t) = (E/2)+e+tg\alpha.t$ and $R(t) = (E/2)- e+ tg\alpha.t$ flanking the normal response Rm of the line (compare FIGS. 2, 4 and 5).

The comparators 54 and 55 function as follows:

The first comparator 54 plays the role of a comparator of the value V(t) with the upper limit V+(t), applies to its output S1 a logic level "O" if V(t) is lower than V+(t), and a logic level "1" if V(t) is greater than V+(t).

The second comparator 55 compares the value V(t) with the lower limit V−(t) and delivers at its output S2 a logic level "0" if V(t) is greater than V−(t) and a logic level "1" if V(t) is less than V−(t).

Thus after a suitable setting of the resistor Rs and of the gain G of amplifier 57, the outputs S1 and S2 represent logic levels showing the state of the line in the active time as shown in FIGS. 4 and 5.

In FIG. 4 there has been illustrated a graph, as a function of time t, of, on the other hand, the potential V(t) and, on the other hand, outputs the logic levels of the output S1 and S2 in case of an open circuit fault. At the instant T1, where the curve of V(t) intersects the line of equation $$V+(t) = (U/2)+f(Rs)+(U/E).tg\alpha.t,$$

the logic level at output S1 changes over from "0" to "1" while the logic level at output S2 remains "0". The time t1 thus corresponds to the time td (see FIG. 2) and is a direct indication of the distance of the place of the fault from the location in which the step signal was applied.

FIG. 5 shows the same curve in case of a defect of the short-circuit type. At the instant tk, where the curve of V(t) intersects the line of equation $V-(t)=(U/2)-f(Rs)+(U/E).tg\alpha/t)$, the logic level at S2 changes over from "0" to "1" while the logic level at output S1 remains "0". The time tk thus detected can directly read the distance of the place of the fault.

Consequently the appearance of a logic level "1" at one or the other of the outputs S1 and S2 indicates both the nature of the defect and its distance from the signal source.

The outputs S1, S2 are connected respectively to the inputs of two shift registers 60 and 61 each having m stages where m is the maximum count of the counter 50. The command inputs of the two registers 60 and 61 are connected to the output of the AND gate 49 which thus synchronizes the shifting in the register with the count of the counter 50 only during the active cycle.

The contents "0" or "1" of each stage of the two registers are indicated by a respective lamp, the two series of m lamps 62 and 63 associated with the two registers being disposed on the panel of the apparatus in the form of two superimposed light bars.

The shift registers 60 and 61 function in the manner of conventional shift registers of the serial input and parallel output type, as summarized below: if $\epsilon i$ designates the logic level "0" or "1", registered in the first stage at time ti, and if Qj designates the state of the $J^{th}$ stage, in time tm, after the last shift of the cycle, $Qj = \epsilon m - (j-1)$. More specifically, for the extreme stages it is apparent that $Q1 = \epsilon m$ and $Qm = \epsilon 1$.

Thus, on the panel or face of the apparatus the lamps 62 and 63 are operated in decreasing order of their indices i, and one obtains a representation of the value $\epsilon i$ in increasing order of the same indices, i.e., increasing as a function of the time ti. The lights of the two light bars are thus illuminated such that the m columns represent the place of the defect and the two lines represent the nature of the defect. During each cycle of the cycle $T=m/f1$, the shift registers 60 and 61 register in their m stages logic levels at the outputs S1 and S2 at the successive instants $t1 = 1/f1, t2 = 2/f1, \ldots, tm = m/f1 = T$.

At the end of the active cycle, of duration T. all the lamps 62 or 63 are thus extinguished if they represent at instant ti a corresponding output S1 or S2 which is at a logic value "0", and are illuminated if at that instant ti the corresponding output is at a logic level "1".

Thus the line of lights which are illuminated indicates the type of defect (open circuit by the lights 62 or short circuit by the lights 63) such that number or order of the first light illuminated represents the instant t1 or tk (FIGS. 4 and 5) representing the place of the fault.

For the practical interpretation of the result it is desirable to provide above or below the two light bars, a strip of paper indicating the numbers of the pylons of the ski lift represented by the corresponding vertical rows of lights, each light therefore representing a certain section of the safety line.

Satisfactory functioning of the system of the present invention requires certain conditions:

Firstly, it is necesary to choose the instant $t1=1/f1$ in such manner that the value V(t) is already comprised between the limiting values V+(t) and V−(t) at that instant, so that a fault is not registered by the rising flank of the curve V(t) at the start of each cycle.

Secondly, it is important that each analysis period, of a duration $P = 1/f2$, is divided into a first time $T=m/f1$ over which the shift registers function, and a second period $T'=(1/f2)-(m/f1)$ over which the registers are fixed. The eye of the observer, however, sees only the state of the lamps during the dead time T' and it is thus necessary that, on the one hand, the predominant state of the lamps corresponds to the dead time so that P is substantially greater than 2T and the frequency f1 is substantially greater than 2m.f2 of the clocks 44 and 45; on the other hand, the period P can remain small, corresponding to the persistance of the retina image increased by the time constant of the lamps, if the lamps have a time constant.

Furthermore, it is necessary to provide for each analysis period a ded time T' sufficient to enable the discharge, during each cycle, of the various capacitors or condensers of the circuit, especially condensers 58 and 59.

Finally, it is advantageous if the clock 44 of frequency f1 is variable in order to accommodate the m points of comparison along the length of the security line.

Before the initial use of the device on a particular line, it is essential to adjust the internal resistance Rg of the pulse generator 47 with respect to the resistance characteristic Rc of the line such that V(t) is approximately equal to U/2 for a value of t in the neighborhood of zero. The gain G of amplifier 57 can also be adjusted rapidly to a desirable value, preferably with several tests on the safety line in the absence of a fault.

The unit described above permits localization of transient faults since the latter will result in intermettent operation of the respective lamps.

The invention is, of course, not limited to the sole embodiment of the circuit which has been described above by way of example. It embraces, within the scope of the appended claims, all embodiments in which equivalent means are used to put into effect the same process. For example, the integrator 56, which introduces the oscillating term as a linear function of time t, is able to be replaced by an incremental device synchronized by the counter 50 and delivering a sawtooth signal increasing with time.

We claim:

1. A process for locating a fault along a security line for a cable railway which comprises the steps of:
   applying to said security line a voltage pulse capable of generating a response in the form of an electrical echo signal from an end of the line;
   detecting the response of the line in the form of an echo signal to the voltage pulse; and
   comparing the detected response to the normal response of the same line in the absence of a fault, thereby producing a signal representing a sense of deviation from the normal response and a time of deviation of said signal, whereby the sense of deviation of said signal represents the nature of the fault and the time of said deviation represents the location of the fault along the line, the response of the line being compared to two predetermined values flanking the normal response, the results of these comparisons being expressed as logic levels "0" and "1", registering the logic levels at successive instants over an interval corresponding to a predetermined frequency, and collecting the registered results and displaying same at the end of a period of time sufficient to permit analysis of the line over its entire length, the period defined by said frequency being small by comparison to the time for reflection of said echo signal.

2. The process defined in claim 1 wherein said values flanking the normal response are linear functions of time.

3. The process defined in claim 1 wherein such voltage pulses are voltage steps applied periodically with a frequency such that the duration of application of said step is small by comparison to the dead time between applications of said steps, said signals being displayed during said dead time.

4. A system for localizing faults in a security line for a cable railway, comprising in combination:
   a first clock having a frequency corresponding to successive instants in which results are to be displayed;
   a second clock operatively connected to said first clock and defining a frequency of analysis of said line which is less than the frequency of the first clock;
   a step-signal generator triggered at each pulse of the second clock and applying a voltage step to said line inducing an electrical echo response in said line;
   means for delivering two electrical levels representing values flanking a normal echo response of said line in the absence of a fault;
   two comparators adapted to compare the echo response of said line with respective ones of said values whereby the comparator outputs indicate the locale of a fault represented by an echo response deviating from said normal echo response; and
   means for registering and displaying the outputs of said comparators, said comparators being operatively connected to said first clock for triggering thereby at each pulse thereof.

5. The system defined in claim 4, further comprising a bistable multivibrator having an output connected to said signal generator for energizing same, a first input connected to said second clock, and a second input; and a counter having an output connected to said second input and connected to said first clock for counting the maximum number corresponding to the number of successive instants over which said comparators are to compare the response of said line with said values.

6. The system defined in claim 5, further comprising an AND gate having one input connected to the output of said first clock, a second input connected to said output of said bistable multivibrator, and having an output connected to the input of said counter and to said means for registering and displaying said results.

7. The system defined in claim 4 wherein said means delivering said two levels comprises three electrical resistors connected in series between two points of predetermined potential, the two outer resistors being of fixed value and the central resistor being adjustable, the points between said central resistor and said outer resistors being connected to respective inputs of said comparators.

8. The system defined in claim 7, further comprising means for generating a corrective signal constituting a linear function of time and of nul value at the beginning of each analysis period as defined by said second clock, and respective condensors connecting said points of said resistors to said means for generating said corrective signal.

9. The system defined in claim 6, further comprising a means for generating a corrective signal as a linear function of time, said corrective signal being applied to said comparators, said means for delivering said corrective signal comprising an integrator connected to the output of said bistable multivibrator, and an amplifier connected between said integrator and the respective comparator, said amplifier having an adjustable gain.

10. The system defined in claim 6, further comprising means for delivering a corrective signal as a linear function of time to said comparators, the last mentioned means being constituted by incrementing units synchronized by said counter.

11. The system defined in claim 4 wherein the means for registering and displaying said results comprises two shift registers having a number of stages corresponding to the number of successive instants over which said comparators operate, said shift registers having signal inputs connected to the outputs of respective ones of said comparators and shifting inputs connected to the outputs of said first clock.

12. The system defined in claim 11 wherein the display means comprises two luminous light bars having lamps each connected to one of the stages of a respective one of said shift registers and indicating by its stage of illumination whether the logic registered in the corresponding stage is "0" or "1".

* * * * *